United States Patent [19]

Ackley et al.

[11] 4,348,763
[45] Sep. 7, 1982

[54] MULTIPLE STRIPE LEAKY MODE LASER

[75] Inventors: Donald E. Ackley, Los Altos; Reinhart W. H. Engelmann, Mountain View; Dietrich Kerps, Palo Alto, all of Calif.

[73] Assignee: Hewlett-Packard Company, Palo Alto, Calif.

[21] Appl. No.: 176,166

[22] Filed: Aug. 7, 1980

[51] Int. Cl.³ .............................................. H01S 3/19
[52] U.S. Cl. ...................................... 372/45; 372/46
[58] Field of Search ................ 331/94.5 H; 357/17, 357/18; 372/46, 45, 50

[56] References Cited

PUBLICATIONS

Scifres et al., "Phase-Locked Semiconductor Laser Array", *Applied Physics Letters*, vol. 33, No. 12, Dec. 1978, pp. 1015-1017.
Tsang et al., "A Densely Packed Monolithic Linear Array of GaAs-Al$_x$Ga$_{1-x}$As Strip Buried Heterostructure Lasers", *Applied Physics Letters*, vol. 34, No. 2, Jan. 1979, pp. 162-165.
Scifres et al., "High-Power Coupled-Multiple-Stripe Phase-Locked Injection Laser", *Applied Physics Letters*, vol. 34, No. 4, Feb. 1979, pp. 259-261.
Saito et al., "Buried-Heterostructure AlGaAs Lasers", *IEEE Journal of Quantum Electronics*, vol. QE-16, No. 2, Feb. 1980, pp. 205-206.
Burnham et al., "Improved Leaky Mole Buried Heterostructure (BH) Injection Lasers", *Xerox Disclosure Journal*, vol. 4, No. 3, May/Jun. 1979, pp. 357-358.

*Primary Examiner*—James W. Davie
*Attorney, Agent, or Firm*—Jon R. Stark

[57] ABSTRACT

A semiconductor laser is provided in which multiple stripe regions are optically coupled in leaky mode operation.

1 Claim, 2 Drawing Figures

MULTIPLE STRIPE LEAKY MODE LASER

BACKGROUND OF THE INVENTION

Semiconductor lasers are well known devices in which the injection of charge carriers across one or more semiconductor junctions results in stimulated emission of radiation. Mirrored facets on the device are provided to form a cavity in which the stimulated emission will produce lasing in an active layer when the injected current density is above a certain threshold level. High output power operation of these devices is limited by the susceptibility of the mirror facets to catastrophic damage when illuminated at high intensity.

High power semiconductor lasers in the prior art generally had broad emitting areas to spread the optical field. This reduced the intensity incident on the mirror facets to prevent facet damage. However, such devices often suffered from a lack of control over oscillation of lateral modes in the junction plane. This could lead to filamentation and self-focussing, producing unsatisfactory variations in the far-field intensity distribution pattern. A further disadvantageous result of uncontrolled lateral modes was non-linearities or "kinks" in the relation between current and output flux.

Another prior art attempt to produce a high power device used an array of narrow stripes to laterally confine charge carrier flow. Stripe widths of about 3-5 μm inhibited oscillation in unwanted lateral modes, while the device operated as an array of many low power lasers. By closely packing the stripes with center-to-center spacing of 8-15 μm, some interaction of the optical evanescent fields from neighboring stripes could be achieved. Examples of these devices are described in papers by Scifres, et al. (*Applied Physics Letters*, Vol. 33, No. 12, December 1978) and Tsang, et al. (*Applied Physics Letters*, Vol. 34, No. 2, January 1979). However, these devices suffered the disadvantages that individual lasing regions did not begin to lase, or "turn on", simultaneously when a current pulse was injected. This could cause an unstable far-field pattern during the turn on period. Another disadvantage was that coupling between lasing regions tended to diminish at high driving currents.

A variation of the closely packed stripe array device used curved conducting contacts to connect the stripes in the array. As reported by Scifres, et al. (*Applied Physics Letters*, Vol. 34, No. 4, February 1979), this improved the coupling between stripes, reducing the severity of the disadvantages. However, these devices still suffered from non-simultaneous turn on and loss of coupling at high driving currents.

SUMMARY OF THE INVENTION

In accordance with the preferred embodiments of the present invention, a semiconductor laser includes multiple active stripe regions which are separated by passive regions. The refractive index of the passive regions is selected to permit leaky mode operation of the laser, which provides optical coupling between neighboring stripe regions. The leaky mode optical coupling produces nearly simultaneous turn on of the stripes across the laser and gives rise to a simple far-field pattern which is stable at high drive currents. In one preferred embodiment, a positive refractive index step is introduced at the lateral boundaries of the stripe regions to reduce the threshold current density for lasing.

DESCRIPTION OF THE PREFERRED EMBODIMENTS

Figure 1:
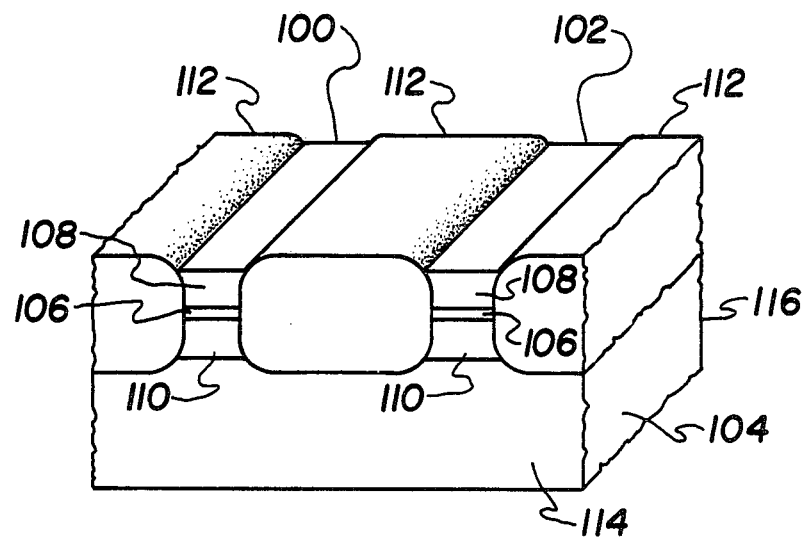
FIG. 1 shows a portion of a semiconductor laser having multiple leaky mode coupled stripe regions.

Referring to FIG. 1, a semiconductor laser includes a pair of stripe regions 100 and 102 which lie on a substrate 104. Each stripe region contains an active layer 106 confined between a pair of clad layers 108 and 110. Three passive regions 112 lie on the substrate at the lateral boundaries of the stripe regions. Facets 114 and 116 are cleaved to act as mirrors.

In a preferred embodiment, substrate 104 is composed of n-type GaAs. Stripe regions 100 and 102 are preferably formed by a three-layer liquid phase epitaxial growth, followed by etching to leave stripe regions of about 2 μm in width, with center-to-center spacing of about 24 μm. Thickness of about 0.15 μm is preferred for the active layer, which is preferably composed of p-type $Al_{0.06}Ga_{0.94}As$. Clad layer 108 is preferably composed of p-type $Al_{0.3}Ga_{0.7}As$, while clad layer 110 is of n-type $Al_{0.3}Ga_{0.7}As$. After etching the stripe regions, a second epitaxial growth is performed to form the passive regions 112, preferably of undoped, high resistivity material such as $Al_{0.17}Ga_{0.83}As$. Although two stripe regions are illustrated for clarity and ease of description in FIG. 1, those skilled in the art will recognize that the same construction techniques and operating principles described herein may be extended to more than two stripes.

In the embodiment discussed above, the refractive index of clad layers 108 and 110 is about 3.42, while active layer 106 has a refractive index of about 3.625. Because the active layer is thin compared to the width of the stripe regions, it is known that the stripe regions may be described by an effective refractive index $n_{eff}$; for example, a discussion of the effective refractive index by K. Saito and R. Ito may be found in *IEEE Journal of Quantum Electronics*, Vol. QE-16, No. 2, February 1980, at page 206. In the preferred embodiment, $n_{eff}$ is about 3.475. Passive regions 112 have a refractive index $n_p$, preferably about 3.525, so that $n_p$ exceeds $n_{eff}$ by a $\Delta n$ of about 0.05, producing a step in refractive index at the lateral boundaries of the stripe regions.

In operation, charge carriers are injected into the laser to induce lasing in the active layer of each stripe region. The refractive index step at the stripe region boundaries leads to refraction out of the stripe region into the adjoining passive regions. Each stripe region then operates in a so called "leaky" mode, with radiation leaking into the passive regions. The resulting power propagating between the stripe regions leads to dilution of the intensity incident on the facets and to optical coupling between the stripe regions, with the passive regions acting as low-loss passive waveguides.

Radiation leaks out of the stripe regions into the passive regions at a shallow angle $\theta$ given by $$\sin \theta = (n_p^2 - n_{eff}^2)^{\frac{1}{2}} n_p.$$

For a $\Delta n$ of 0.05, chosen to ensure leaky mode operation with reasonable threshold current density, the angle $\theta$ is about 9.7°. The leaky rays lead to optical coupling between stripe regions by exciting a high-order mode of the passive region. The lasing mode between strip regions is effectively that mode whose propagation angle most closely matches the angle at which radiation is refracted out of the stripe regions. Optical coupling between stripe regions is further enhanced by interaction of the leaky wavefronts with the fields in the stripe regions, which affects the relative phase in the stripe regions, introducing a fixed phase shift. In the far-field intensity distribution pattern, the phase difference causes a densely spaced lobe pattern centered about the facet normal. In embodiments with more than two stripe regions, each adjacent pair of stripe regions is opticaly coupled by leaky rays in a passive region separating the pair.

Figure 2:
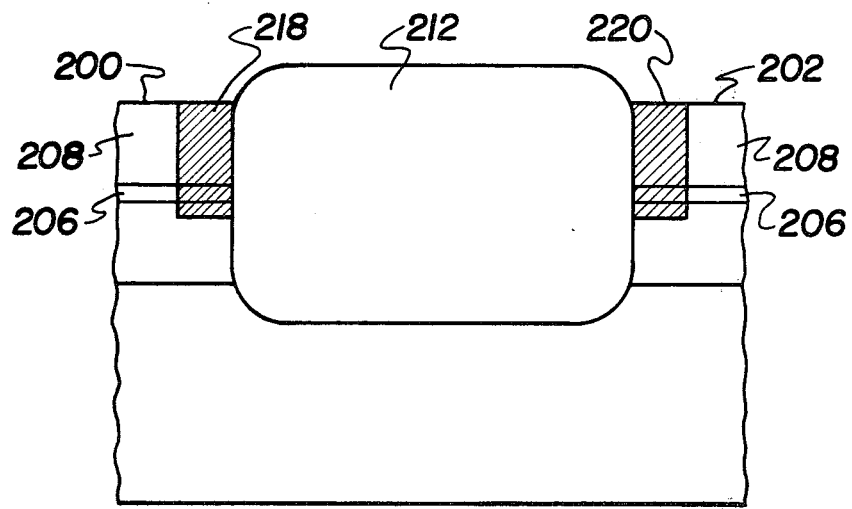
FIG. 2 is an end view of a portion of another semiconductor laser having multiple leaky mode coupled stripe regions.

Referring to FIG. 2, another embodiment of the invention includes a positive refractive index step at the lateral boundaries of a pair of stripe regions 200 and 202. Zones 218 and 220 along the boundaries have refractive index about 0.01 larger than the effective refractive index of the stripe regions, but smaller than the refractive index of passive region 212. This refractive index step may be introduced by diffusion of a p-dopant, such as zinc, through clad layers 208 and n-type active layer 206. This embodiment has the advantage of providing a substantially lower threshold current density than the embodiment of FIG. 1, and may still be readily constructed and operated with more than two stripe regions.

The embodiments described above all have a three layer structure in the stripe regions for vertical confinement of radiation. Other vertical confinement structures, such as large optical cavity structures, may also be used provided that the refractive indices of the materials are chosen to permit leaky mode operation.

In any of these embodiments, the diluted intensity at the facets due to leakage allows operation at high optical power levels without damage to the facets. In addition, the narrow width of the active layer of the device provides good lateral mode control, leading to stable far-fields and nearly linear output flux characteristics. Another advantageous result is nearly simultaneous turn on across the laser area due to the leaky mode optical coupling between stripe regions. Leaky mode coupling also gives rise to a simple far-field pattern which is stable up to high drive currents. Yet another advantage is that relatively wide spacing between stripe regions may be used without sacrificing good coupling.

We claim:

1. A semiconductor laser comprising:

a substrate of semiconducting material;

a plurality of stripe regions on the substrate, each having an active layer in which lasing is induceable by injection of charge carriers; each of the stripe regions including:

(a) a first clad layer of semiconducting material positioned on the substrate and having lower refractive index than the active layer, the active layer being positioned on the first clad layer;

(b) a second clad layer of semiconducting material positioned on the active layer and having lower refractive index than the active layer;

a plurality of passive regions of semiconducting material positioned on the substrate, adjacent stripe regions being laterally separated by one of the passive regions, the passive regions and the stripe regions being configured to provide leaky mode optical coupling between adjacent stripe regions; each passive region having a refractive index higher than the effective refractive indices of adjoining stripe regions, at least one of the stripe regions including a zone at a lateral boundary having refractive index higher than the effective refractive index of the stripe region but lower than the refractive index of the passive region adjoining the boundary;

a pair of mirrored facets at opposite ends of the substrate; and electrode means for supplying electrical current.

* * * * *

UNITED STATES PATENT AND TRADEMARK OFFICE
CERTIFICATE OF CORRECTION

PATENT NO. : 4,348,763
DATED : Sep. 7, 1982
INVENTOR(S) : Donald E. Ackley, et al.

It is certified that error appears in the above-identified patent and that said Letters Patent are hereby corrected as shown below:

On the title page
In the References Cited, second column, line 9, near end of line "Mole" should read --Mode--;

In Column 2, line 41, at the of line, "," should read --;-- ;

In Column 3, line 3, near end of line, "strip" should read --stripe--.

Signed and Sealed this

Second Day of November 1982

[SEAL]

Attest:

GERALD J. MOSSINGHOFF

Attesting Officer          Commissioner of Patents and Trademarks